United States Patent
Xue et al.

(10) Patent No.: US 11,329,605 B1
(45) Date of Patent: May 10, 2022

(54) MULTI-MODE VOLTAGE CONTROLLED OSCILLATION DEVICE AND WIRELESS TRANSCEIVER

(71) Applicant: SOUTH CHINA UNIVERSITY OF TECHNOLOGY, Guangzhou (CN)

(72) Inventors: Quan Xue, Guangzhou (CN); Chao Li, Guangzhou (CN)

(73) Assignee: SOUTH CHINA UNIVERSITY OF TECHNOLOGY, Guangzhou (CN)

( * ) Notice: Subject to any disclaimer, the term of this patent is extended or adjusted under 35 U.S.C. 154(b) by 0 days.

(21) Appl. No.: 17/354,526

(22) Filed: Jun. 22, 2021

(30) Foreign Application Priority Data

Nov. 11, 2020 (CN) .......................... 202011252811.2

(51) Int. Cl.
*H03B 5/12* (2006.01)
*H04B 1/40* (2015.01)

(52) U.S. Cl.
CPC ..... *H03B 5/1228* (2013.01); *H03B 2200/009* (2013.01); *H04B 1/40* (2013.01)

(58) Field of Classification Search
CPC .......... H04B 1/40; H03B 5/30; H03B 5/1228; H03B 5/1253; H03B 5/00
USPC ...... 331/167, 116 FE, 179, 117 FE; 455/260
See application file for complete search history.

(56) References Cited

U.S. PATENT DOCUMENTS

| 7,423,495 B2 * | 9/2008 | Bevilacqua | H03B 5/1228 |
| | | | 331/117 FE |
| 8,779,865 B2 * | 7/2014 | Ainspan | H03L 7/099 |
| | | | 331/117 FE |
| 9,667,192 B2 * | 5/2017 | Iotti | H03B 5/1228 |

FOREIGN PATENT DOCUMENTS

CN 110661490 A * 1/2020

\* cited by examiner

*Primary Examiner* — Arnold M Kinkead
(74) *Attorney, Agent, or Firm* — Seyfarth Shaw LLP

(57) ABSTRACT

The present disclosure relates to a multi-mode voltage controlled oscillation device and a wireless transceiver. The multi-mode voltage controlled oscillation device includes an oscillation core circuit and at least four resonance circuits. Each of the resonance circuits includes two input ends and one power supply end. The two input ends of each of the resonance circuits are respectively connected to an output end of the oscillation core circuit, and the power supply end of each of the resonance circuits is configured to be connected to a power supply. The multi-mode voltage controlled oscillation device provided by the present disclosure is formed by connecting the oscillation core circuit with each resonance circuit and connecting the resonance circuits with each other, with a simple structure, a tight connection, and a small area.

11 Claims, 11 Drawing Sheets

MULTI-MODE VOLTAGE CONTROLLED OSCILLATION DEVICE AND WIRELESS TRANSCEIVER

CROSS REFERENCE TO RELATED APPLICATIONS

The application claims priority to Chinese Patent Application No. 2020112528112, filed on Nov. 11, 2020, which is incorporated herein by reference in its entirety.

TECHNICAL FIELD

The present disclosure relates to the technical field of wireless communications, and more particularly, to a multi-mode voltage controlled oscillation device and a wireless transceiver.

BACKGROUND

Modern wireless transceivers requires an up-conversion mixing and a down-conversion mixing for a baseband signal by using an oscillation signal, and a most popular method is to use a cross-coupled voltage controlled oscillator with an LC resonator to generate the oscillation signal. Main performance indexes of the voltage controlled oscillator are phase noise and tuning bandwidth. The phase noise is mainly determined by a quality factor and a power consumption of a load resonance network, and the tuning bandwidth is mainly determined by a ratio of a capacitance value of a variable capacitance part in load capacitance to a total capacitance value. Generally, both indexes of the phase noise and the tuning bandwidth are constrained to each other.

In the conventional technology, due to the need to increase a turning range of the cross-coupled voltage controlled oscillator, an area of the voltage controlled oscillator is usually designed to be too large.

SUMMARY

Based on the above, it is necessary to provide a multi-mode voltage controlled oscillation device and a wireless transceiver in view of the above technical problems.

According to an aspect of the present disclosure, a multi-mode voltage controlled oscillation device is provided, including: an oscillation core circuit, and at least four resonance circuits. Each of the resonance circuits includes two input ends and one power supply end. The two input ends of each of the resonance circuit are respectively connected to an output end of the oscillation core circuit, and the power supply end of each resonance circuit is configured to be connected to a power supply.

In an embodiment, the at least four resonance circuits include a first resonance circuit, a second resonance circuit, a third resonance circuit and a fourth resonance circuit. A first input end of the first resonance circuit is connected to a first output end of the oscillation core circuit, a second input end of the first resonance circuit is connected to a second output end of the oscillation core circuit, and a power supply end of the first resonance circuit is connected to the power supply. A first input end of the second resonance circuit is connected to a third output end of the oscillation core circuit, a second input end of the second resonance circuit is connected to a fourth output end of the oscillation core circuit, and a power supply end of the second resonance circuit is connected to the power supply. A first input end of the third resonance circuit is connected to a fifth output end of the oscillation core circuit, a second input end of the third resonance circuit is connected to a sixth output end of the oscillation core circuit, and a power supply end of the third resonance circuit is connected to the power supply. A first input end of the fourth resonance circuit is connected to a seventh output end of the oscillation core circuit, a second input end of the fourth resonance circuit is connected to an eighth output end of the oscillation core circuit, and a power supply end of the fourth resonance circuit is connected to the power supply.

In an embodiment, the first resonance circuit includes: a first inductor, a second inductor, a third inductor, a first capacitor, and a second capacitor. A first end of the first inductor is connected to the first output end of the oscillation core circuit. A first end of the second inductor is connected to the second output end of the oscillation core circuit, and a second end of the second inductor is connected to a second end of the first inductor. A first end of the third inductor is connected to the second end of the second inductor, and a second end of the third inductor is connected to the power supply. A first end of the first capacitor is connected to a first end of the first inductor, and a second end of the first capacitor is grounded. A first end of the second capacitor is connected to the first end of the second inductor, and a second end of the second capacitor is grounded.

In an embodiment, the oscillation core circuit includes: a first oscillation core sub-circuit, a second oscillation core sub-circuit, a third oscillation core sub-circuit, and a fourth oscillation core sub-circuit. A first end of the first oscillation core sub-circuit is connected to the first input end of the first resonance circuit, and a second end of the first oscillation core sub-circuit is connected to the first input end of the second resonance circuit. A first end of the second oscillation core sub-circuit is connected to the second input end of the first resonance circuit, and a second end of the second oscillation core sub-circuit is connected to the second input end of the second resonance circuit. A first end of the third oscillation core sub-circuit is connected to the second input end of the third resonance circuit, and a second end of the third oscillation core sub-circuit is connected to the second input end of the fourth resonance circuit. A first end of the fourth oscillation core sub-circuit is connected to the first input end of the third resonance circuit, and a second end of the fourth oscillation core sub-circuit is connected to the first input end of the fourth resonance circuit.

In an embodiment, the first oscillation core sub-circuit includes: a current source, a first field effect transistor, and a second field effect transistor. A first end of the current source is grounded. A gate of the first field effect transistor is connected to the first input end of the first resonance circuit, a source of the first field effect transistor is connected to a second end of the current source, and a drain of the first field effect transistor is connected to the first input end of the second resonance circuit. A gate of the second field effect transistor is connected to the first input end of the second resonance circuit, a source of the second field effect transistor is connected to the second end of the current source, and a drain of the second field effect transistor is connected to the first input end of the first resonance circuit.

In an embodiment, the multi-mode voltage controlled oscillation device further includes: a switch circuit, connected to the input ends of each of the resonance circuits respectively; and a control device, connected to a control end of the switch circuit, and configured to control connection/disconnection among the input ends of the resonance circuits through the switch circuit, so as to generate different resonance frequencies.

In an embodiment, the switch circuit includes: a first switch sub-circuit, a second switch sub-circuit, a third switch sub-circuit, and a fourth switch sub-circuit. A first input end of the first switch sub-circuit is connected to the second input end of the first resonance circuit, a second input end of the first switch sub-circuit is connected to the second input end of the second resonance circuit, a first output end of the first switch sub-circuit is connected to the first input end of the first resonance circuit, a second output end of the first switch sub-circuit is connected to the first input end of the second resonance circuit, and a control end of the first switch sub-circuit is connected to the control device. A first input end of the second switch sub-circuit is connected to the first input end of the first resonance circuit, a second input end of the second switch sub-circuit is connected to the first input end of the second resonance circuit, a first output end of the second switch sub-circuit is connected to the first input end of the third resonance circuit, a second output end of the second switch sub-circuit is connected to the first input end of the fourth resonance circuit, and a control end of the second switch sub-circuit is connected to the control device. A first input end of the third switch sub-circuit is connected to the second input end of the fourth resonance circuit, a second input end of the third switch sub-circuit is connected to the second input end of the third resonance circuit, a first output end of the third switch sub-circuit is connected to the first input end of the fourth resonance circuit, a second output end of the third switch sub-circuit is connected to the first input end of the third resonance circuit, and a control end of the third switch sub-circuit is connected to the control device. A first input end of the fourth switch sub-circuit is connected to the second input end of the first resonance circuit, a second input end of the fourth switch sub-circuit is connected to the second input end of the second resonance circuit, a first output end of the fourth switch sub-circuit is connected to the second input end of the third resonance circuit, a second output end of the fourth switch sub-circuit is connected to the second input end of the fourth resonance circuit, and a control end of the fourth switch sub-circuit is connected to the control device.

In an embodiment, the first switch sub-circuit includes: a third field effect transistor, a fourth field effect transistor, an inverter, a fifth field effect transistor, and a sixth field effect transistor. A gate of the third field effect transistor is connected to the control device, a drain of the third field effect transistor is connected to the second input end of the first resonance circuit, and a source of the third field effect transistor is connected to the first input end of the first resonance circuit. A gate of the fourth field effect transistor is connected to the control device, a drain of the fourth field effect transistor is connected to the second input end of the second resonance circuit, and a source of the fourth field effect transistor is connected to the first input end of the second resonance circuit. An input end of the inverter is connected to the control device. A gate of the fifth field effect transistor is connected to an output end of the inverter, a drain of the fifth field effect transistor is connected to the second input end of the first resonance circuit, and a source of the fifth field effect transistor is connected to the first input end of the second resonance circuit. A gate of the sixth field effect transistor is connected to an output end of the inverter, a drain of the sixth field effect transistor is connected to a second input end of the second resonance circuit, and a source of the sixth field effect transistor is connected to the first input end of the first resonance circuit.

In an embodiment, the third field effect transistor, the fourth field effect transistor, the fifth field effect transistor and the sixth field effect transistor are all P-channel field effect transistors.

According to another aspect of the present disclosure, a wireless transceiver is provided, including the multi-mode voltage controlled oscillation device according to the above aspect.

According to embodiments of the present disclosure, a multi-mode voltage controlled oscillation device and a wireless transceiver are provided. The multi-mode voltage controlled oscillation device includes an oscillation core circuit and at least four resonance circuits. Each resonance circuit includes two input ends and one power supply end. The two input ends of each resonance circuit are respectively connected to an output end of the oscillation core circuit, and a power supply end of each resonance circuit is configured to be connected to a power supply. The multi-mode voltage controlled oscillation device provided by the embodiments is formed by connecting the oscillation core circuit with each resonance circuit and connecting the resonance circuits with each other, with a simple structure, a tight connection and a small area.

BRIEF DESCRIPTION OF THE DRAWINGS

To describe the technical solutions in the embodiments of the present disclosure or in the conventional technology more clearly, the following briefly introduces the figures required for describing the embodiments or the conventional technology. Obviously, the figures in the following description are merely some embodiments of the present disclosure. For a person skilled in the art, without involving any inventive effort, other figures may also be obtained from these figures.

Figure 1:
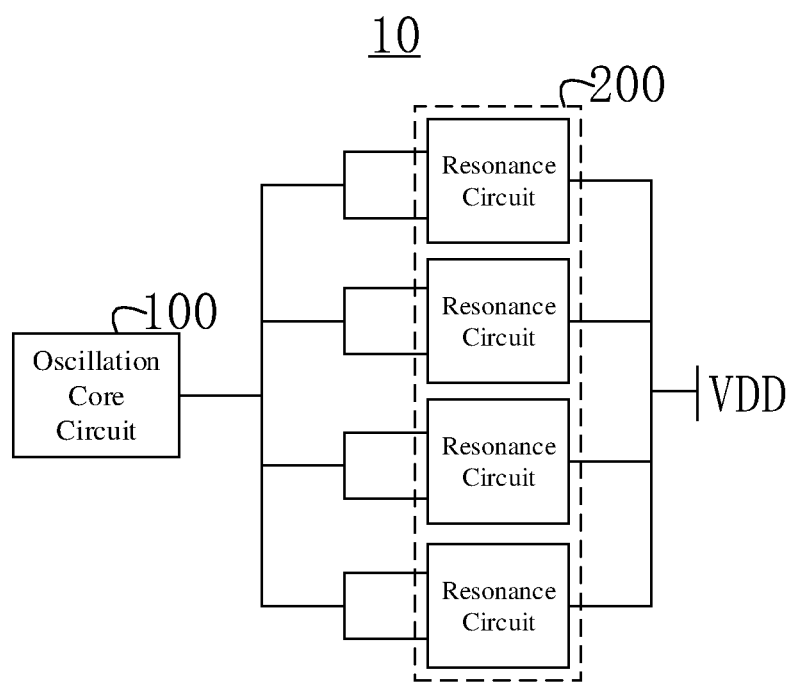
FIG. 1 is a schematic structural diagram illustrating a multi-mode voltage controlled oscillation device according to an embodiment of the present disclosure.

DESCRIPTION OF REFERENCE NUMERALS 10, multi-mode voltage controlled oscillation device;
100, oscillation core circuit;
110, first oscillation core sub-circuit;
111, current source;
120, second oscillation core sub-circuit;
130, third oscillation core sub-circuit;
140, fourth oscillation core sub-circuit;
200, resonance circuit;
210, first resonance circuit;
220, second resonance circuit;
230, third resonance circuit;
240, fourth resonance circuit;
300, switch circuit;
310, first switch sub-circuit;
311, inverter;
320, second switch sub-circuit;
330, third switch sub-circuit;
340, fourth switch sub-circuit; and
400, control device.

DETAILED DESCRIPTION OF THE EMBODIMENTS

In order to make the above objects, features and advantages of the present disclosure more apparent, the specific embodiments of the present disclosure will be described in detail below with reference to the accompanying drawings. Many specific details are set forth in the following description to facilitate a sufficient understanding of the present disclosure. However, the present disclosure can be embodied in many other manners different from those described herein, and those skilled in the art can make similar improvements without departing from the scope of the present disclosure, and therefore the present disclosure is not limited by the specific embodiments disclosed below.

The technical solutions of the present disclosure and the technical solutions of the present disclosure will be described in detail below with reference to specific embodiments. The following specific embodiments may be combined with each other, and the same or similar concepts or processes may be omitted in some embodiments. Hereinafter, embodiments of the present disclosure will be described with reference to the accompanying drawings.

Herein, the serial numbers themselves, such as "first", "second", etc., are used to distinguish the described objects, without any order or technical meaning. The terms "connect" and "couple" in the present disclosure include direct and indirect connection (coupling) as no special description. In the description of the present disclosure, it should be understood that the azimuth or positional relationship indicated by the terms "upper", "lower", "front", "rear", "left", "right", "vertical", "horizontal", "top", "bottom", "inner", "outer", "clockwise", and "counterclockwise" is based on the azimuth or positional relationship shown in the figures. Only for the convenience of description of the present disclosure and simplified description. Instead of indicating or implying that the indicated device or element must have a particular orientation, be constructed and operated in a particular orientation, It is therefore not to be construed as limiting the present disclosure.

In the present disclosure, unless expressly specified and defined otherwise, the first feature "upper" or "lower" in the second feature may be that the first and second features are in direct contact, or the first and second features are separated by an intermediate medium. Moreover, the first feature "above", "on", and "over" the second feature may be that the first feature is directly above or obliquely above the second feature, or merely indicate that the first feature level is higher than the second feature. The first feature is "below", "under", and "beneath" the second feature may be that the first feature is directly below or obliquely below the second feature, or merely represents that the level of the first feature is less than that of the second feature.

The multi-mode voltage controlled oscillation device provided in the present disclosure can be applied to various types of communication systems, for example, the multi-mode voltage controlled oscillation device can be applied to a transceiver in a wireless communication system. The multi-mode voltage controlled oscillation device generates an oscillation signal for and up-conversion mixing and down-conversion mixing.

Referring to FIG. 1, an embodiment of the present disclosure provides a multi-mode voltage controlled oscillation device 10. The multi-mode voltage controlled oscillation device 10 includes an oscillation core circuit 100 and at least four resonance circuits 200. Each resonance circuit 200 includes two input ends and one power supply end. The two input ends of each resonance circuit 200 are respectively connected to an output end of the oscillation core circuit 100, and a power supply end of each resonance circuit 200 is connected to a power supply. The oscillation core circuit 100 includes a plurality of output ends, and the plurality of output ends respectively correspond to the two output ends of each resonance circuit 200. The oscillation core circuit 100 may provide different phases to each resonance circuit 200 through the plurality of output ends, so that an equivalent inductance value of each resonance circuit 200 can be changed, and thus each resonance circuit can oscillate at at least three different resonance frequencies, thereby generating oscillation signals of different frequencies. Meanwhile, the oscillation core circuit 100 may generate a negative impedance, thereby compensating impedance in each resonance circuit 200, so that each resonance circuit 200 can stably output the oscillation signals. The oscillation core circuit 100 may include a plurality of oscillation core sub-circuits. Types and structures of the oscillation core circuit 100 are not limited in this embodiment, as long as the functions thereof can be realized. A circuit formed by an inductor and a capacitor, which can generate a resonance phenomenon at one or more frequencies, is collectively referred to as the resonance circuit. The resonance circuit 200 may be categorized into a series resonance circuit and a parallel resonance circuit. The type of each resonance circuit 200 and number of the resonance circuits are not limited in this embodiment, and the user may choose according to the actual application.

In a specific embodiment, firstly, the oscillation core circuit 100 provides excitation signals with different phrases to each resonance circuit 200, and thus different phrases are provided to each resonance circuit 200, so as to realize a coarse adjustment of the resonance frequency of each resonance circuit 200. Then, values of various devices in each resonance circuit 200 are changed, so as to realize a fine adjustment of the resonance frequency of each resonance circuit 200.

The multi-mode voltage controlled oscillation device 10 provided in this embodiment includes the oscillation core circuit 100 and at least four resonance circuits 200. The input ends of the resonance circuits 200 are respectively connected to the output ends of the oscillation core circuit 100, and the power supply end of each resonance circuits 200 is configured to be connected to the power supply. The multi-mode voltage controlled oscillation device 10 provided by this embodiment is formed by connecting the oscillation core circuit 100 with each resonance circuit 200 and connecting the resonance circuits 200 with each other, with a simple structure a tight connection and a small area. Furthermore, by using the oscillation core circuit 100, each of the resonance circuits 200 can oscillate at at least three different resonance frequencies.

Figure 2:
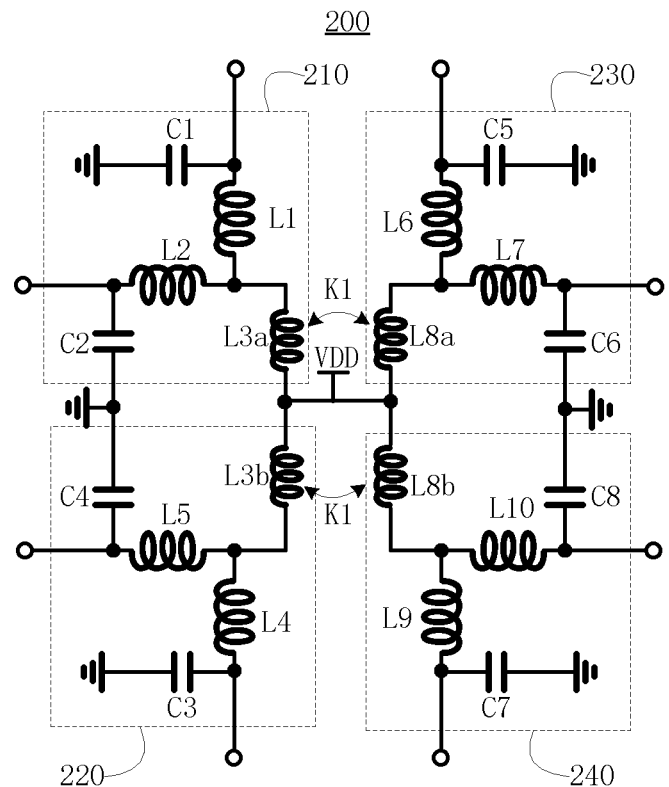
FIG. 2 is a schematic structural diagram illustrating each resonance circuit according to an embodiment of the present disclosure.

Referring to FIG. 2, in an embodiment, the at least four resonance circuits 200 include a first resonance circuit 210, a second resonance circuit 220, a third resonance circuit 230, and a fourth resonance circuit 240.

A first input end of the first resonance circuit 210 is connected to a first output end of the oscillation core circuit 100, a second input end of the first resonance circuit 210 is connected to a second output end of the oscillation core circuit 100, and a power supply end of the first resonance circuit is configured to be connected to the power supply. The first resonance circuit 210 may be an LC oscillation circuit, and the specific structure of the first resonance circuit 210 is not limited in this embodiment, as long as the function thereof can be realized.

Continuously referring to FIG. 2, in an embodiment, the first resonance circuit 210 includes an inductor L1, an inductor L2, an inductor L3a, a capacitor C1, and a capacitor C2. A first end of the inductor L1 is connected to a first output end of the oscillation core circuit 100; a first end of the inductor L2 is connected to a second output end of the oscillation core circuit 100, and a second end of the inductor L2 is connected to a second end of the inductor L1. A first end of the inductor L3a is connected to a second end of the inductor L2, and a second end of the inductor L3a is configured to be connected to the power supply. A first end of the capacitor C1 is connected to the first end of the inductor L1, and a second end of the capacitor C1 is grounded. A first end of the capacitor C2 is connected to the first end of the inductor L2, and a second end of the capacitor C2 is grounded.

The first end of the inductor L1 serves as the first input end of the first resonance circuit 210 and is connected to the first output end of the oscillation core circuit 100. The first end of the inductor L2 serves as the second input end of the first resonance circuit 210 and is connected to the second output end of the oscillation core circuit 100. The inductor L1 and the capacitor C2 form an LC parallel resonance circuit, and the inductor L2 and the capacitor C2 form another LC parallel resonance circuit. In this embodiment, specific values of the inductor L1, the inductor L2, the inductor L3a, the capacitor C1 and the capacitor C2 are not limited, and a user may set the values of the inductor L1, the inductor L2, the inductor L3a, the capacitor C1 and the capacitor C2 according to a required resonance frequency.

A first input end of the second resonance circuit 220 is connected to a third output end of the oscillation core circuit 100, and a second input end of the second resonance circuit 220 is connected to a fourth output end of the oscillation core circuit 100. The second resonance circuit 220 and the first resonance circuit 210 have a same structure. For the detailed description of the second resonance circuit 220, reference may be made to the description of the first resonance circuit 210, and details are not described herein again.

Continuously referring to FIG. 2, in an embodiment, the second resonance circuit 220 includes an inductor L4, an inductor L5, an inductor L3b, a capacitor C3, and a capacitor C4. A first end of the inductor L4 is connected to the third output end of the oscillation core circuit 100, a second end of the inductor L4 is connected to a first end of the inductor L3b, and a second end of the inductor L3b is configured to be connected to the power supply. A first end of the inductor L5 is connected to a second end of the inductor L4, and a second end of the inductor L5 is connected to the fourth output end of the oscillation core circuit 100. A first end of the capacitor C3 is connected to a first end of the inductor L4, and a second end of the capacitor C3 is grounded. A first end of the capacitor C4 is connected to a second end of the inductor L5, and a second end of the capacitor C4 is grounded.

The first end of the inductor L4 serves as the first input end of the second resonance circuit 220 and is connected to the third output end of the oscillation core circuit 100. The second end of the inductor L5 serves as the second input end of the second resonance circuit 220 and is connected to the fourth output end of the oscillation core circuit 100. The capacitor C3 of the inductor L4 forms an LC parallel resonance circuit, and the inductor L5 and the capacitor C5 form another LC parallel resonance circuit. In this embodiment, specific values of the inductor L4, the inductor L5, the inductor L3b, the capacitor C3 and the capacitor C4 are not limited, and the user may set the values of the inductor L4, the inductor L5, the inductor L3b, the capacitor C3 and the capacitor C4 according to the required resonance frequency.

A first input end of the third resonance circuit 230 is connected to a fifth output end of the oscillation core circuit 100, a second input end of the third resonance circuit 230 is connected to a sixth output end of the oscillation core circuit 100, and a power supply end of the third resonance circuit 230 is configured to be connected to the power supply. The third resonance circuit 230 and the first resonance circuit 210 have a same structure. For the detailed description of the second resonance circuit 230, reference may be made to the description of the first resonance circuit 210, and details are not described herein again.

Continuously referring to FIG. 2, in an embodiment, the third resonance circuit 230 includes an inductor L6, an inductor L7, an inductor L8a, a capacitor C5, and a capacitor C6. A first end of the inductor L6 is connected to the fifth output end of the oscillation core circuit 100. A first end of the inductor L7 is connected to the sixth output end of the oscillation core circuit 100, and a second end of the inductor L7 is connected to a second end of the inductor L6. A first end of the inductor L8a is connected to the second end of the inductor L7, and a second end of the inductor L8 is connected to the power supply. The inductor L8a and the inductor L3a are coupled to each other, and the coupling coefficient is K1. A first end of the capacitor C5 is connected to the first end of the inductor L6, and a second end of the capacitor C5 is grounded. A first end of the capacitor C6 is connected to the first end of the inductor L7, and a second end of the capacitor C6 is grounded.

The first end of the inductor L6 serves as the first input end of the third resonance circuit 230 and is connected to the fifth output end of the oscillation core circuit 100, and the first end of the inductor L7 serves as the second input end of the third resonance circuit 230 and is connected to the sixth output end of the oscillation core circuit 100. The capacitor C5 of the inductor L6 forms an LC parallel resonance circuit, and the inductor L7 and capacitor C6 form another LC parallel resonance circuit. In this embodiment, specific values of the inductor L6, the inductor L7, the inductor L8a, the capacitor C5 and the capacitor C6 are not limited, and the user may set the values of the inductor L6, the inductor L7, the inductor L8a, the capacitor C5 and the capacitor C6 according to the required resonance frequency.

A first input end of the fourth resonance circuit 240 is connected to a seventh output end of the oscillation core circuit 100, and a second input end of the fourth resonance circuit 240 is connected to an eighth output end of the oscillation core circuit 100. The fourth resonance circuit 240 and the second resonance circuit 220 have a same structure. For the detailed description of the fourth resonance circuit 240, reference may be made to the description of the second resonance circuit 220, and details are not described herein again.

Continuously referring to FIG. 2, in an embodiment, the fourth resonance circuit 240 includes an inductor L9, an inductor L10, an inductor L8b, a capacitor C7, and a capacitor C8. A first end of the inductor L9 is connected to the seventh output end of the oscillation core circuit 100, a second end of the inductor L9 is connected to a first end of the inductor L8b, and a second end of the inductor L8b is configured to be connected to the power supply. A first end of the inductor L10 is connected to the second end of the inductor L9, and a second end of the inductor L10 is connected to the eighth output end of the oscillation core circuit 100. The inductor L8b and the inductor L3b are coupled to each other, and the coupling coefficient is also K1. A first end of the capacitor C7 is connected to the first end of the inductor L9, and a second end of the capacitor C7 is grounded. A first end of the capacitor C8 is connected to the second end of the inductor L10, and a second end of the capacitor C8 is grounded.

Figure 3:
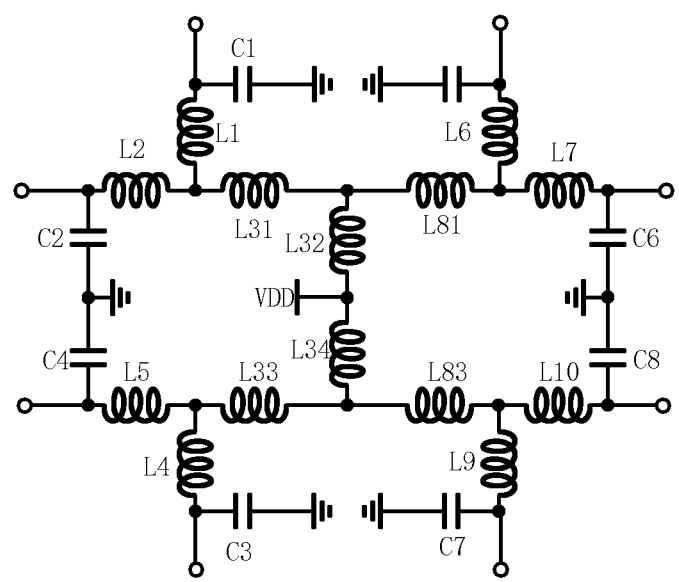
FIG. 3 is a schematic structural diagram illustrating each resonance circuit according to an embodiment of the present disclosure.
Figure 4:
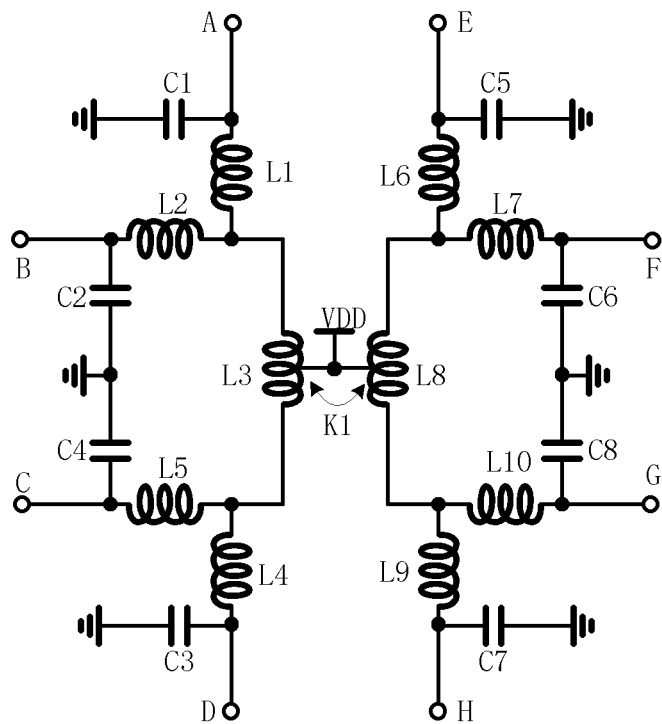
FIG. 4 is a schematic structural diagram illustrating each resonance circuit according to an embodiment of the present disclosure.

The first end of the inductor L9 serves as the first input end of the fourth resonance circuit 240 and is connected to the seventh output end of the oscillation core circuit 100, and the second end of the inductor L10 serves as the second input end of the fourth resonance circuit 240 and is connected to the eighth output end of the oscillation core circuit 100. The inductor L9 and the capacitor C7 form an LC parallel resonance circuit, and the inductor L10 and the capacitor C8 form another LC parallel resonance circuit. In this embodiment, the specific values of the inductor L10, the inductor L10, the inductor L8b, the capacitor C7 and the capacitor C8 are not limited, and the user may set the values of the inductor L10, the inductor L10, the inductor L8b, the capacitor C7 and the capacitor C8 according to the required resonance frequency. In a specific embodiment, according to an inductance equivalent relationship, the resonance circuit shown in FIG. 2 may be equivalent to the resonance circuit shown in FIG. 3 or equivalent to the resonance circuit shown in FIG. 4.

In this embodiment, the oscillation core circuit 100 provides energy and phases to the first resonance circuit 210, the second resonance circuit 220, the third resonance circuit 230, and the fourth resonance circuit 240, so that each resonance circuit oscillates at four resonance frequencies, and the tuning range of the multi-mode voltage controlled oscillation device 10 can be increased.

Figure 5:
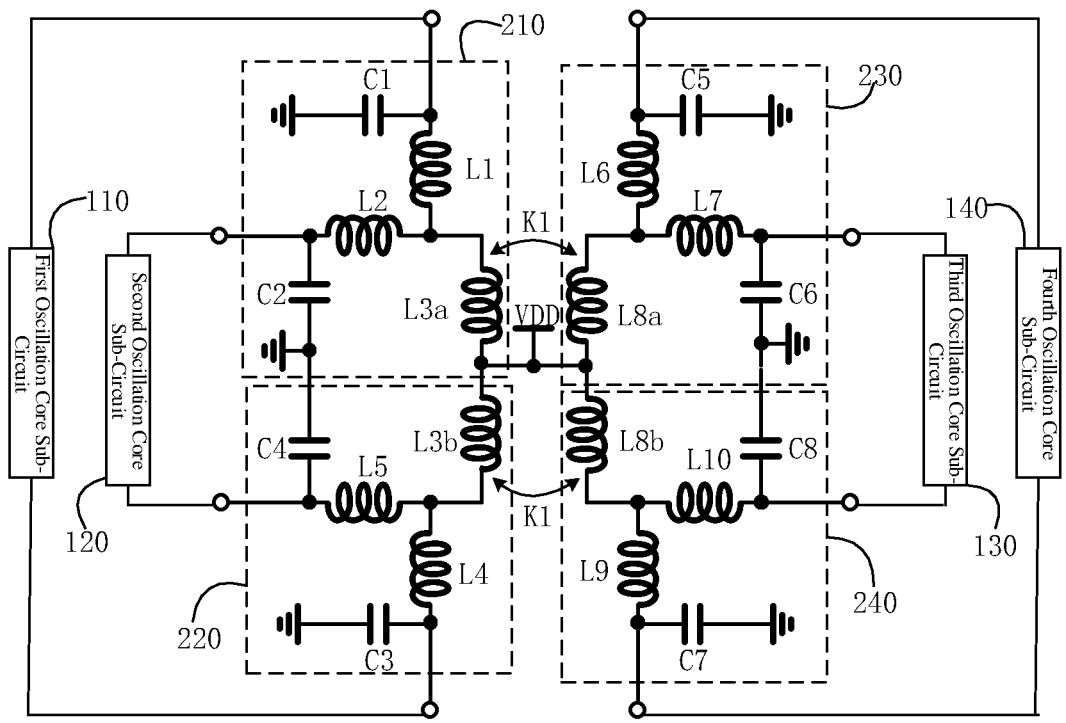
FIG. 5 is a schematic structural diagram illustrating a multi-mode voltage controlled oscillation device according to an embodiment of the present disclosure.

Referring to FIG. 5, in an embodiment, the oscillation core circuit 100 includes a first oscillation core sub-circuit 110, a second oscillation core sub-circuit 120, a third oscillation core sub-circuit 130, and a fourth oscillation core sub-circuit 140.

A first end of the first oscillation core sub-circuit 110 is connected to the first input end of the first resonance circuit 210, and a second end of the first oscillation core sub-circuit 110 is connected to the first input end of the second resonance circuit 220. A first end of the second oscillation core sub-circuit 120 is connected to the second end of the first resonance circuit 210, and a second end of the second oscillation core sub-circuit 120 is connected to the second input end of the second resonance circuit 220. A first end of the third oscillation core sub-circuit 130 is connected to the second input end of the third resonance circuit 230, and a second end of the third oscillation core sub-circuit 130 is connected to the second input end of the fourth resonance circuit 240. A first end of the fourth oscillation core sub-circuit 140 is connected to the first input end of the third resonance circuit 230, and a second end of the fourth oscillation core sub-circuit 140 is connected to a first input end of the fourth resonance circuit 240.

The first end of the first oscillation core sub-circuit 110 serves as the first output end of the oscillation core circuit 100 and is connected to the first output end of the first resonance circuit 210, and a second end of the first oscillation core sub-circuit 110 serves as the third output end of the oscillation core circuit 100 and is connected to the first input end of the second resonance circuit 220. The phases provided by the first and second ends of the first oscillation core sub-circuit 110 are reversed. The first end of the second oscillation core sub-circuit 120 serves as the second output end of the oscillation core circuit 100 and is connected to the second input end of the first resonance circuit, and the second end of the second oscillation core sub-circuit 120 serves as the fourth output end of the oscillation core circuit 100 and is connected to the second output end of the second resonance circuit 220. The phases provided by the first and second ends of the second oscillation core sub-circuit 120 are reversed. The first end of the third oscillation core sub-circuit 130 serves as the sixth output end of the oscillation core circuit 100 and is connected to the second input end of the third resonance circuit 230, and the second end of the third oscillation core sub-circuit 130 serves as the eighth end of the oscillation core circuit 100 and is connected to the second input end of the fourth resonance circuit 240. The phases provided by the first and second ends of the third oscillation core sub-circuit 130 are reversed. The first end of the fourth oscillation core sub-circuit 140 serves as the fifth output end of the oscillation core circuit 100 and is connected to the first input end of the third resonance circuit 230, and the second end of the fourth oscillation core sub-circuit 140 serves as the seventh end of the oscillation core circuit 100 and is connected to the first input end of the fourth resonance circuit 240. The phases provided by the first and second ends of the fourth oscillation core sub-circuit 140 are reversed.

Figure 6:
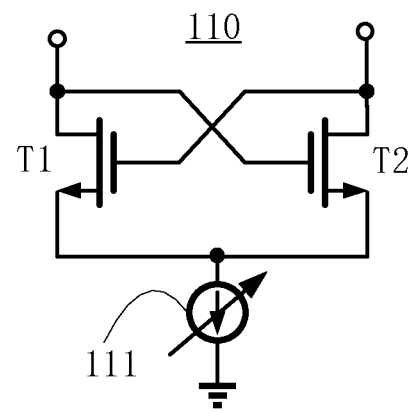
FIG. 6 is a schematic structural diagram illustrating a first oscillation core sub-circuit according to an embodiment of the present disclosure.

Referring to FIG. 6, in an embodiment, the first oscillation core sub-circuit 110 includes a current source 111, a field effect transistor T1, and a field effect transistor T2. A first end of the current source is grounded. A gate of the field effect transistor T1 is connected to the first input end of the first resonance circuit 210, a source of the field effect transistor T1 is connected to a second end of the current source, and a drain of the field effect transistor T1 is connected to the first input end of the second resonance circuit 220. A gate of the field effect transistor T2 is connected to the first input end of the second resonance circuit 220, a source of the field effect transistor T2 is connected to the second end of the current source, and a drain of the field effect transistor T2 is connected to the first input end of the first resonance circuit 210.

The gate of the field effect transistor T1 and the drain of the field effect transistor T2 serve together as a first end of the first oscillation core sub-circuit 110 and are both connected to the first input end of the first resonance circuit 210. The drain of the field effect transistor T1 and the gate of the field effect transistor T2 serve together as the second end of the first oscillation core sub-circuit 110 and are both connected to the first input end of the second resonance circuit 220. The field effect transistor T1 and the field effect transistor T2 are N-channel field effect transistors. The current source 111 is controllable, that is, the user can control the current output by the current source 111 according to the actual application. In this embodiment, the power consumption of each resonance circuit 200 can be reduced by the controllable current source 111, and the phase noise of the output signal of each resonance circuit 200 can be improved. Meanwhile, the field effect transistor T1 and the field effect transistor T2 connected in a cross-coupled manner may generate a negative impedance, thereby compensating the impedance generated by each resonance circuit 200, to ensure that each resonance circuit 200 stably outputs the resonance signals.

Structures of the first oscillation core sub-circuit 110, the second oscillation core sub-circuit 120, the third oscillation core sub-circuit 130, and the fourth oscillation core sub-circuit 140 may be the same or different. For the detailed description of the second oscillation core sub-circuit 120, the third oscillation core sub-circuit 130, and the fourth oscillation core sub-circuit 140, reference may be made to the description of the first oscillation core sub-circuit 120, and details are not described herein again. The specific structure of each oscillation core sub-circuit in this embodiment is not limited as long as the function thereof can be realized. In a specific embodiment, the four oscillation core sub-circuits work simultaneously, so that the phase noise of the output signal of each resonance circuit can be reduced by 6 dB.

Figure 7:
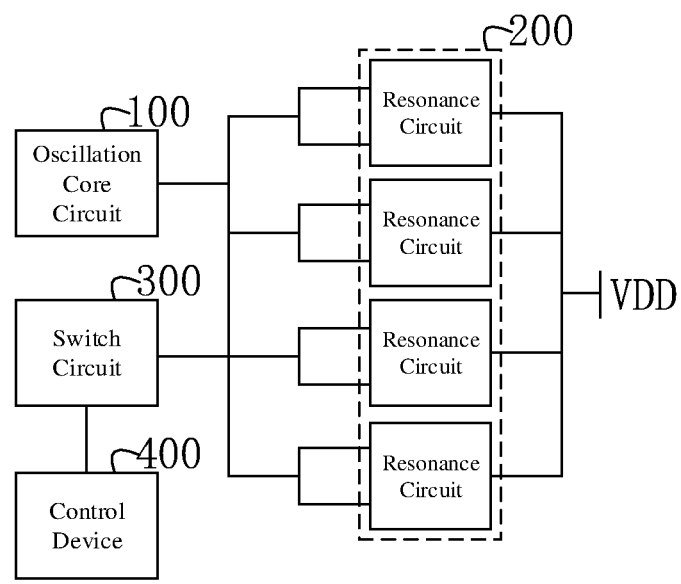
FIG. 7 is a schematic structural diagram illustrating a multi-mode oscillation device according to an embodiment of the present disclosure.

Referring to FIG. 7, in an embodiment, the multi-mode voltage controlled oscillation device 10 further includes a switch circuit 300 and a control device 400. The switch circuit 300 is connected to the input end of each resonance circuit 200. The control device 400 is connected to a control end of the switch circuit 300, and is configured to control connection/disconnection among the input ends of the resonance circuits 200 through the switch circuit 300, so as to generate different resonance frequencies. The switch circuit 300 may include an input end, an output end and the control end. The input end of the switch circuit 300 is connected to the input ends of the resonance circuits 200 respectively, the output end of the switch circuit 300 is also connected to the input ends of the resonance circuits 200 respectively, and the control end of the switch circuit 300 is connected to the control device 400. The structure of the switch circuit 300 is not limited in this embodiment, as long as the function thereof can be realized. The control device 400 may be a computer device or a control chip, and the computer device may be, but is not limited to, various industrial computers, notebook computers, smart phones, tablet computers, and portable wearable devices.

Figure 8:
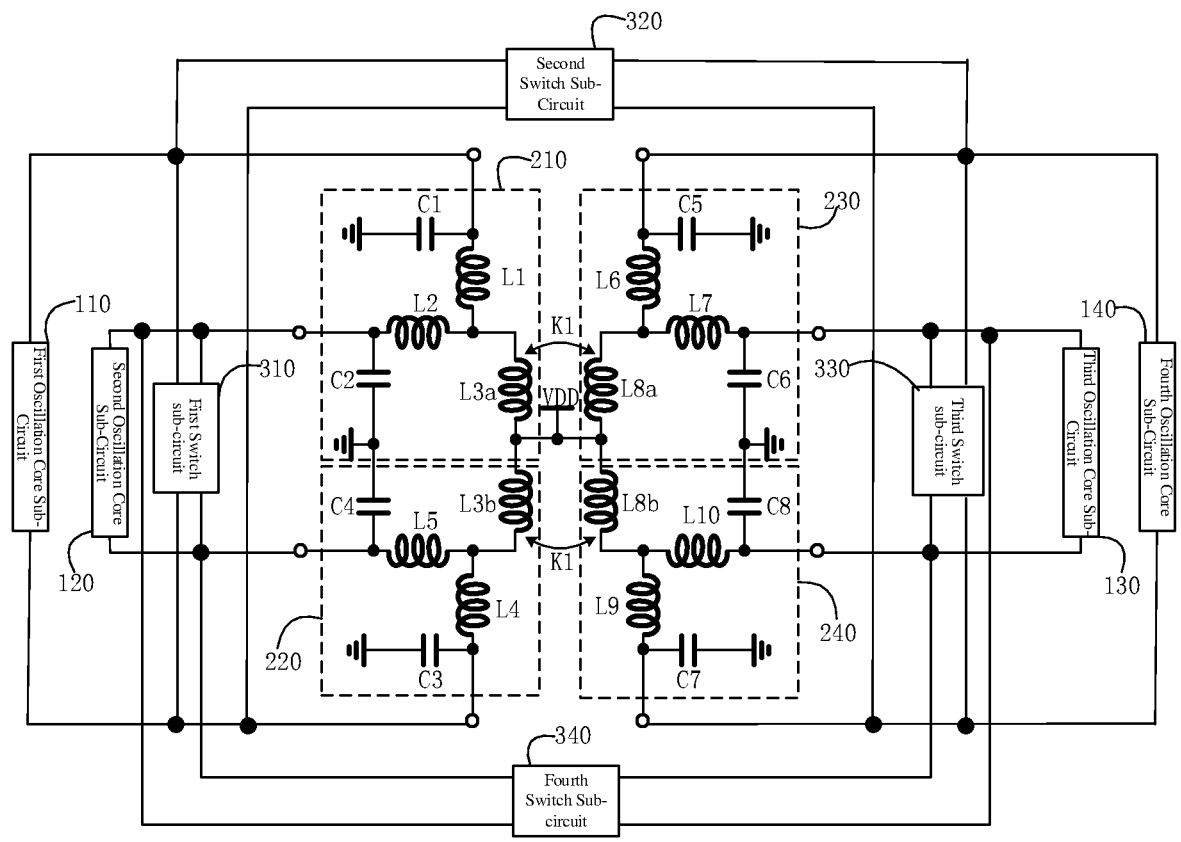
FIG. 8 is a schematic structural diagram illustrating a multi-mode oscillation device according to an embodiment of the present disclosure.

Referring to FIG. 8, in an embodiment, the switch circuit 300 includes a first switch sub-circuit 310, a second switch sub-circuit 320, a third switch sub-circuit 330, and a fourth switch sub-circuit 340. Each switch sub-circuit includes two input ends and two output ends.

A first input end of the first switch sub-circuit 310 is connected to the second input end of the first resonance circuit 210. A second input end of the first switch sub-circuit is connected to the second input end of the second resonance circuit 220. A first output end of the first switch sub-circuit 310 is connected to the first input end of the first resonance circuit 210. A second output end of the first switch sub-circuit 310 is connected to the first input end of the second resonance circuit 220. A control end of the first switch sub-circuit 310 is connected to the control device 400.

Figure 9:
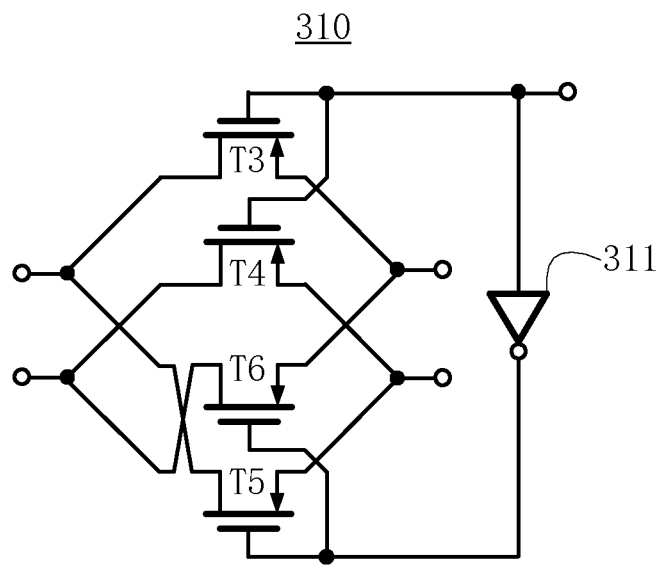
FIG. 9 is a schematic structural diagram illustrating a first switch sub-circuit according to an embodiment of the present disclosure.

Referring to FIG. 9, in an embodiment, the first switch sub-circuit 310 includes a field effect transistor T3, a field effect transistor T4, an inverter 311, a field effect transistor T5, and a field effect transistor T6.

A gate of the field effect transistor T3 is connected to the control device 400, a drain of the field effect transistor T3 is connected to the second input end of the first resonance circuit 210, and a source of the field effect transistor T3 is connected to the first input end of the first resonance circuit 210. A gate of the field effect transistor T4 is connected to the control device 400, a drain of the field effect transistor T4 is connected to the second input end of the second resonance circuit 220, and a source of the field effect transistor T4 is connected to the first input end of the second resonance circuit 220. An input end of the inverter 311 is connected to the control device 400. A gate of the field effect transistor T5 is connected to an output end of the inverter 311, a drain of the field effect transistor T5 is connected to the second input end of the first resonance circuit 210, and a source of the field effect transistor T5 is connected to the first input end of the second resonance circuit 220. A gate of the field effect transistor T6 is connected to the output end of the inverter 311, a drain of the field effect transistor T6 is connected to the second input end of the second resonance circuit 220, and a source of the field effect transistor T6 is connected to the first input end of the first resonance circuit 210.

In this embodiment, types of the field effect transistor T3, the field effect transistor T4, the field effect transistor T5 and the field effect transistor T6 are the same. That is, the field effect transistor T3, the field effect transistor T4, the field effect transistor T5 and the field effect transistor T6 are all P-channel field effect transistors. The inverter 311 is a device that can invert a phase of an output signal by 180 degrees. That is, if a control signal output by the control device 400 can turn on the field effect transistor T3 and the field effect transistor T4, the control signal will turn off the field effect transistor T5 and the field effect transistor T6 after passing through the inverter 311. The inverter 311 may be constituted by a typical TTL and NOT gate circuit, and may also be constituted by two enhanced MOS field effect transistors. The specific structure of the inverter 311 is not limited in this embodiment as long as the function thereof can be realized.

In an embodiment, the field effect transistor T3, the field effect transistor T4, the field effect transistor T5 and the field effect transistor T6 are all P-channel field effect transistors. When the control signal output by the control device 400 is a low level signal, the field effect transistor T3 and the field effect transistor T4 are turned on, and the field effect transistor T5 and the field effect transistor T6 are turned off. That is, the second input end of the first resonance circuit 210 is connected to the first input end of the first resonance circuit 210, the second input end of the second resonance circuit 220 is connected to the first input end of the second resonance circuit 220, the second input end of the first resonance circuit 210 is not connected to the first input end of the second resonance circuit 220, and the second input end of the second resonance circuit 220 is not connected to the first input end of the first resonance circuit 210. Accordingly, the phase of the second input end of the first resonance circuit 210 is the same as the phase of the first input end of the first resonance circuit 210, and the phase of the second input end of the second resonance circuit 220 is the same as the phase of the first input end of the second resonance circuit 220. In this embodiment, the types of the field effect transistors in the first switch sub-circuit 310 are the same and need not be distinguished, so that connection errors can be avoided.

A first input end of the second switch sub-circuit 320 is connected to the first input end of the first resonance circuit 210. A second input end of the second switch sub-circuit 320 is connected to the first input end of the second resonance circuit 220. A first output end of the second switch sub-circuit 320 is connected to the first input end of the third resonance circuit 230. A second output end of the second switch sub-circuit 320 is connected to the first input end of the fourth resonance circuit 240. A control end of the second switch sub-circuit 320 is connected to the control device 400. A first input end of the third switch sub-circuit 330 is connected to a second input end of the fourth resonance circuit 240. A second input end of the third switch sub-circuit 330 is connected to the second input end of the third resonance circuit 230. A first output end of the third switch sub-circuit 330 is connected to the first input end of the fourth resonance circuit 240. A second output end of the third switch sub-circuit 330 is connected to the first input end of the third resonance circuit 230. A control end of the third switch sub-circuit 330 is connected to the control device 400. A first input end of the fourth switch sub-circuit 340 is connected to the second input end of the first resonance circuit 210. A second input end of the fourth switch sub-circuit 340 is connected to the second input end of the second resonance circuit 220. A first output end of the fourth switch sub-circuit 340 is connected to the second input end of the third resonance circuit 230. A second output end of the fourth switch sub-circuit 340 is connected to the second input end of the fourth resonance circuit 240. A control end of the fourth switch sub-circuit 340 is connected to the control device 400. The structure of the second switch sub-circuit 320, the third switch sub-circuit 330, and the fourth switch sub-circuit 340 may be the same as the structure of the first switch sub-circuit 310, or may also be different. For detailed description of the second switch sub-circuit 320, the third switch sub-circuit 330, and the fourth switch sub-circuit 340, reference may be made to the description of the first switch sub-circuit 310, and details are not described herein again.

According to another embodiment of the present disclosure, a wireless transceiver is provided, which includes the multi-mode voltage controlled oscillation device 10 provided by the above embodiment. The wireless transceiver may include a transmitter and a receiver. The multi-mode voltage controlled oscillation device 10 is used in the transmitter, which helps the radio frequency (RF) part of the transmitter to modulate the baseband signal to a higher frequency, i.e., to up-convert the frequency of the baseband signal to a specific frequency. The multi-mode voltage controlled oscillation device 10 is used in the receiver, which helps the receiver to down-convert the received signal to a specific frequency band. Since the wireless transceiver includes the multi-mode voltage controlled oscillation device 10, the wireless transceiver has all the structure and benefits of the multi-mode voltage controlled oscillation device 10.

The working principle of the multi-mode voltage controlled oscillation device of the present disclosure will be explained below from a specific embodiment. In this specific embodiment, the first input end and the second input end of the first resonance circuit are respectively referred to as an A end and a B end; the first input end and the second input end of the second resonance circuit are respectively referred to as a D end and a C end; the first input end and the second input end of the third resonance circuit are respectively referred to as an E end and an F end; and the first input end and the second input end of the fourth resonance circuit are respectively referred to as an H end and a G end. The inductor L3a in the first resonance circuit and the inductor L8a in the third resonance circuit are coupled to each other, the coupling coefficient is K1; the inductor L3b in the second resonance circuit and the fourth resonance circuit L8b are coupled to each other, the coupling coefficient is also K1; the inductance value of each of the inductors L3a, L3b, L8a and L8b is $L_1(1+K1)/2$; the inductance value of each of the other inductors in the resonance circuit is L2; and the capacitance value of each of the capacitors is C. The first switch sub-circuit is denoted as SW1, the second switch sub-circuit is denoted as SW2, the third switch sub-circuit is denoted as SW3, and the fourth switch sub-circuit is denoted as SW4. The types of field effect transistors in each switch sub-circuit are all the same, and all of the field effect transistors can be turned on by the low level. The low level is denoted as "0", and the high level is denoted as "1". By controlling the on/off of the switch circuit by the control device, phases of signals output at the input ends of each resonance circuit can be made different, and the specific analysis is as follows.

Figure 10:
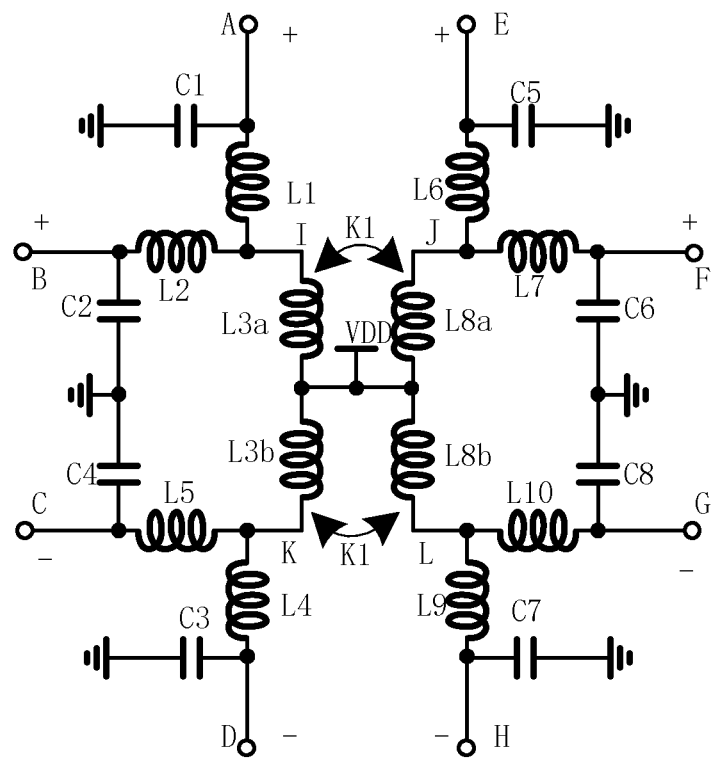
FIG. 10 is a schematic structural diagram illustrating a multi-mode voltage controlled oscillation device according to an embodiment of the present disclosure.
Figure 11:
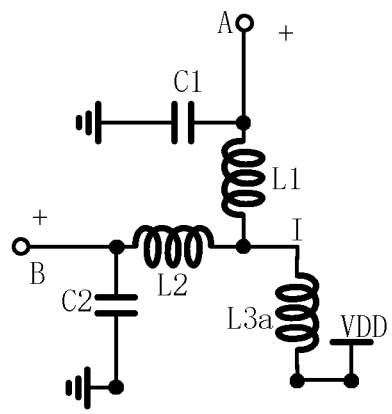
FIG. 11 is a schematic diagram illustrating an equivalent structure of a resonance circuit according to an embodiment of the present disclosure.
Figure 12:
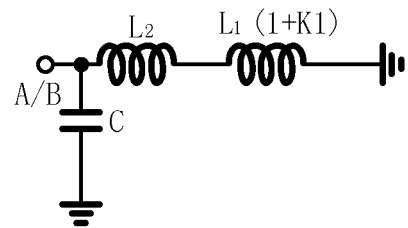
FIG. 12 is a schematic diagram illustrating an equivalent structure of a resonance circuit according to an embodiment of the present disclosure.

(1) When SW1=0, SW2=0, SW3=0, and SW4=0, the B end and the A end in the resonance circuit are connected, the C end and the D end are connected, the A end and the E end are connected, the D end and the H end are connected, the G end and the H end are connected, the F end and E end are connected, and the C end and G end are connected. At this time, signals output at the A end and the B end are in a same phase, signals output at the B end and the C end are in inverted phases, signals output at the C end and the D end are in a same phase, signals output at the E end and the A end are in a same phase, signals output at the D end and the H end are in a same phase, signals output at the H end and the G end are in a same phase, signals output at the F end and the E end are in a same phase, and signals output at the G end and the F end are in inverted phases. As shown in FIG. 10, "+" denotes a same phase and "−" denotes an inverted phase. Because signals at the A end and the B end are in a same phase, and a signal at a point I is the superposition of the signals at the A end and the B end, the signal at the point I is in a same phrase with the signals at the A end and the B end. By the same reasoning, the relative phases of signals at three points J, K and L can be analyzed. That is, signals at the point I and the point J are in a same phase, signals at the point J and the point L are in an inverted phrase, signals at the point L and the point K are in a same phase, and signals at the point K and the point I are in inverted phases. Due to the symmetry of the structure, a resonance circuit is taken for analysis as an example as shown in FIG. 11. The even-odd mode analysis method is used for analysis. At this time, the resonance circuit is in an even mode. As viewed from the A end or the B end, the equivalent resonance circuit of FIG. 11 can be represented as the circuit shown in FIG. 12. As viewed from the A end, the inductance value of the inductor L3a becomes two times as it is, i.e., L1(1+K1). Further, since the inductor L1 is connected in series, the inductance value finally obtained is L1(1+K1)+L2. Further in view of the capacitor C1, the equivalent resonance frequency of the resonance circuit viewed from the A end is $$f_1 = 1 / \left(2\pi\sqrt{(L_1(1+K1)+L_2)C}\right).$$

Equivalent resonance frequencies viewed from the other ends of each resonance circuit are the same as the equivalent resonance frequency viewed from the A end.

Figure 13:
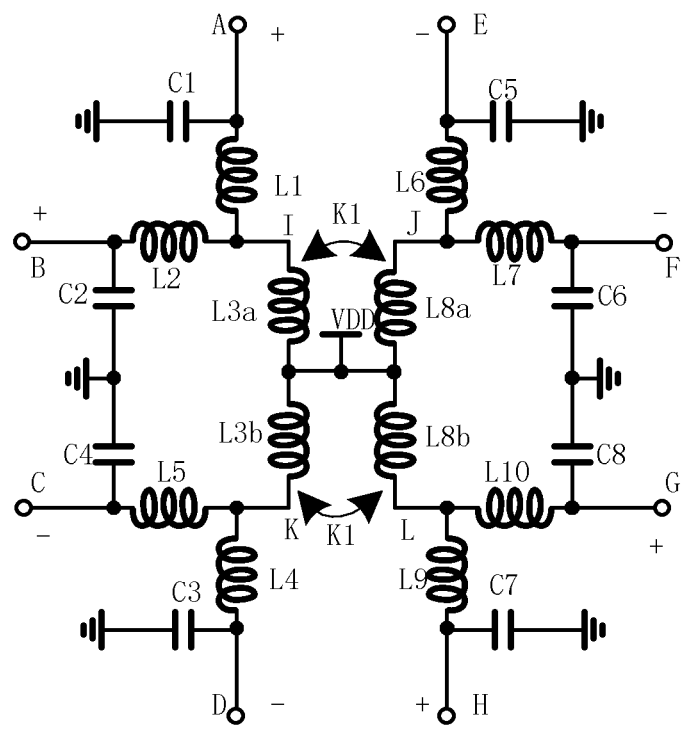
FIG. 13 is a schematic structural diagram illustrating a multi-mode voltage controlled oscillation device according to an embodiment of the present disclosure.
Figure 14:
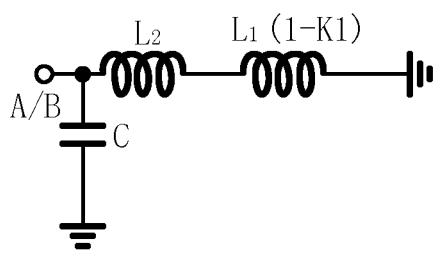
FIG. 14 is a schematic diagram illustrating an equivalent structure of a resonance circuit according to an embodiment of the present disclosure.

(2) When SW1=0, SW2=1, SW3=0, SW4=1, signals output at the A end and the B end are in a same phase, signals output at the B end and the C end are in inverted phases, signals output at the C end and the D end are in a same phase, signals output at the G end and the F end are in inverted phases, signals output at the E end and the A end are in inverted phases, signals output at the D end and the E end are in a same phase, signals output at the H end and the G end are in a same phase, and signals output at the F end and the E end are in a same phase, as shown in FIG. 13. Because signals output at the A end and the B end are in a same phase, and a signal at a point I is the superposition of the signals at the A end and the B end, the signal at the point I is in a same phrase with the signals at the A end and the B end. By the same reasoning, the relative phases of signals at three points J, K and L can be analyzed. That is, signals at the point I and the point J are in inverted phases, signals at the point J and the point L are in an inverted phrase, signals at the point L and the point K are in inverted phases, and signals at the point K and the point I are in inverted phases. Due to the symmetry of the structure, a resonance circuit is taken for analysis as an example as shown in FIG. 11. The even-odd mode analysis method is used for analysis. At this time, the resonance circuit is in an even mode. As viewed from the A end or from the B end, and the equivalent resonance circuit of FIG. 11 can be represented as the circuit shown in FIG. 14. The inductance value of the inductor L3a becomes two times as it is, i.e., L1(1+K1). Further in view of the inductor L1 being connected in series, the equivalent resonance frequency of the resonance circuit viewed from the A end is $$f_2 = 1 / \left(2\pi\sqrt{(L_1(1+K1)+L_2)C}\right).$$

By the same reasoning, equivalent resonance frequencies viewed from the other ends of each resonance circuit are the same as the equivalent resonance frequency viewed from the A end.

Figure 15:
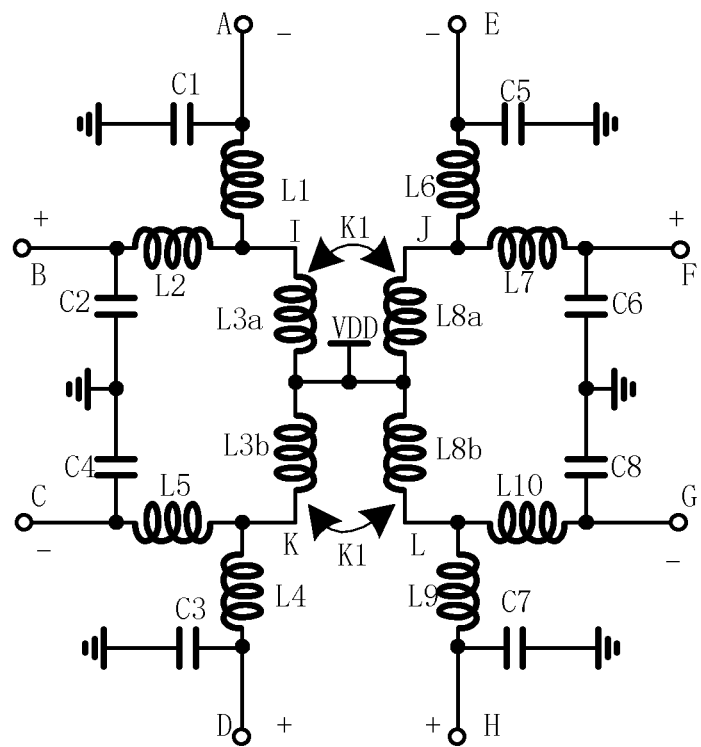
FIG. 15 is a schematic structural diagram illustrating a multi-mode voltage controlled oscillation device according to an embodiment of the present disclosure.
Figure 16:
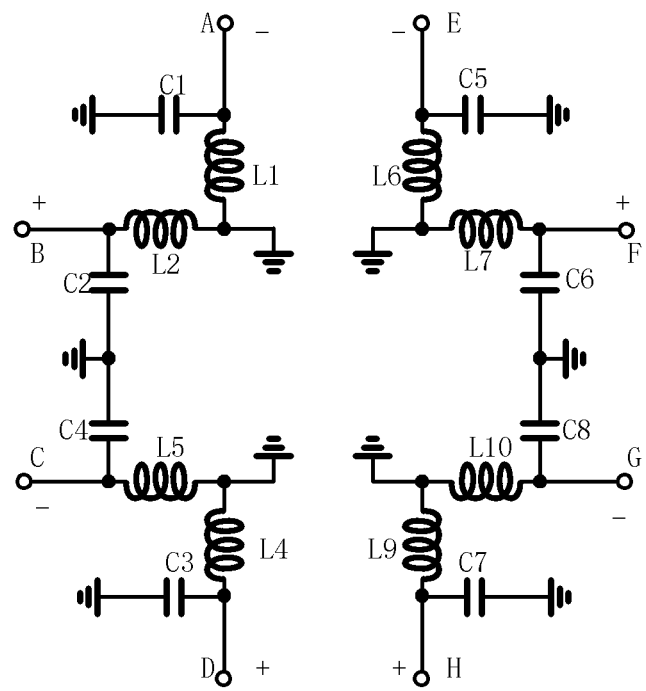
FIG. 16 is a schematic structural diagram illustrating a multi-mode voltage controlled oscillation device according to an embodiment of the present disclosure.
Figure 17:
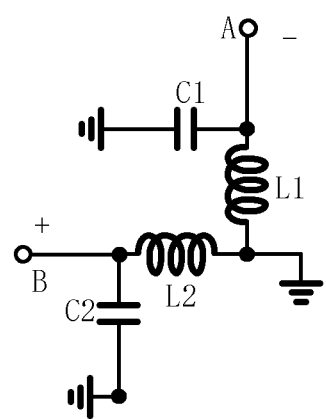
FIG. 17 is a schematic diagram illustrating an equivalent structure of a resonance circuit according to an embodiment of the present disclosure.
Figure 18:
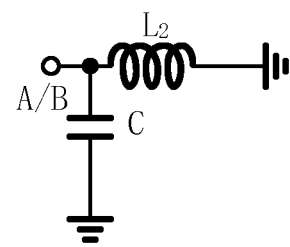
FIG. 18 is a schematic diagram illustrating an equivalent structure of a resonance circuit according to an embodiment of the present disclosure.

(3) When SW1=1, SW2=0, SW3=1, SW4=0, signals output at the B end and the D end are in a same phase, signals output at the B end and the C end are in inverted phases, signals output at the C end and the A end are in a same phase, signals output at the A end and the B end are in inverted phases, signals output at the A end and the E end are in a same phase, signals output at the E end and the H end are in inverted phases, signals output at the D end and the H end are in a same phase, signals output at the G end and the E end are in a same phase, and signals output at the F end and the G end are in inverted phases, as shown in FIG. 15. Because signals output at the A end and the B end are in inverted phases, and a signal at a point I is the superposition of the signals at the A end and the B end, the point I is a point of virtual ground. By the same reasoning, it can be obtained that the three points of J, K and L are also a point of virtual ground. In this case, a transformer constituted by the inductor L3a, the inductor L3b, the inductor L8a and the inductor L8b are virtually connected to ground, and the their function to each resonance circuit is disappeared, as shown in FIG. 16. Also, due to the symmetry of the structure, a resonance circuit is taken for analysis as an example, as shown in FIG. 17. The even-odd mode analysis method is used for analysis. At this time, the resonance circuit is in an odd mode. As viewed from the A end or from the B end, and the equivalent resonance circuit of FIG. 17 can be represented as the circuit shown in FIG. 18. As viewed from the A end, the inductor L1 and the capacitor C1 are connected in parallel, the equivalent resonance frequency of the resonance circuit viewed from the A end is $$f_3 = 1 / \left(2\pi\sqrt{L_2 C}\right).$$

By the same reasoning, equivalent resonance frequencies viewed from the other ends of each resonance circuit are the same as the equivalent resonance frequency viewed from the A end.

Figure 19:
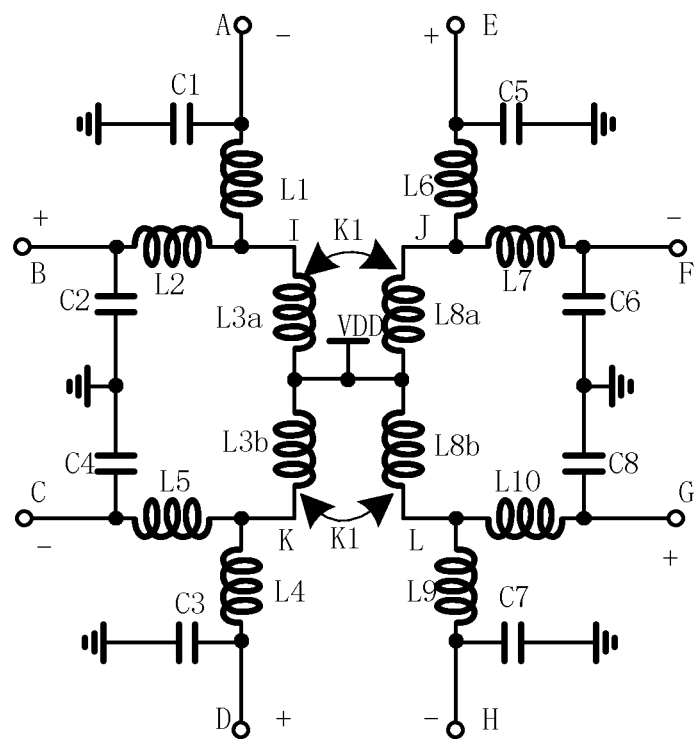
FIG. 19 is a schematic structural diagram illustrating a multi-mode voltage controlled oscillation device according to an embodiment of the present disclosure.
Figure 20:
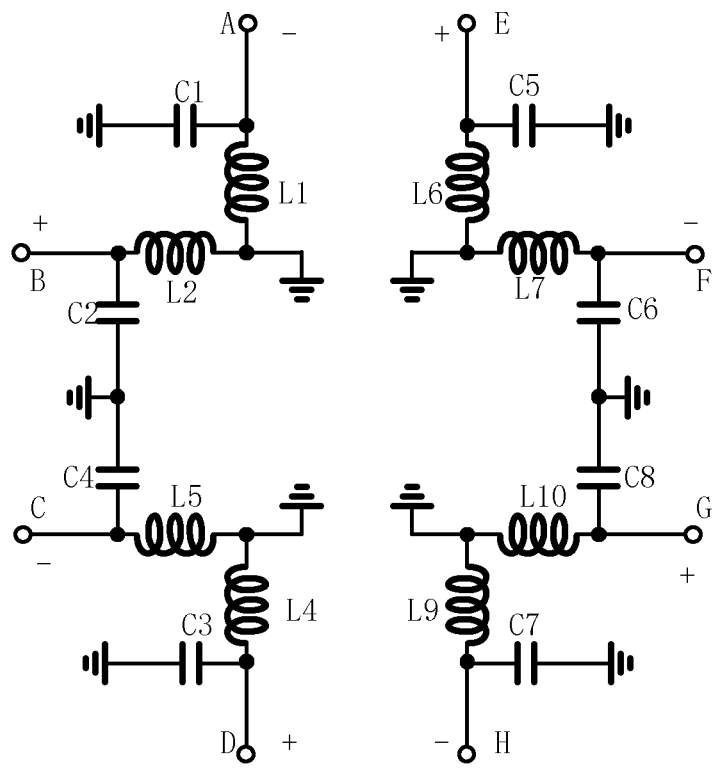
FIG. 20 is a schematic structural diagram illustrating a multi-mode voltage controlled oscillation device according to an embodiment of the present disclosure.

(4) when SW1=1, SW2=1, SW3=1, SW4=1, signals output at the B end and the D end are in a same phase, signals output at the B end and the C end are in inverted phases, signals output at the C end and the A end are in a same phase, signals output at the A end and the B end are in inverted phases, signals output at the A end and the E end are in inverted phases, signals output at the D end and the H end are in inverted phases, signals output at the H end and the G end are in inverted phases, signals output at the F end and the G end are in inverted phases, and signals output at the E end and the F end are in inverted phases, as shown in FIG. 19. Because signals output at the A end and the B end are in inverted phases, and a signal at a point I is the superposition of the signals at the A end and the B end, the point I is a point of virtual ground. By the same reasoning, it can be obtained that the three points of J, K and L are also a point of virtual ground. In this case, a transformer constituted by the inductor Lia, the inductor L3b, the inductor L8a and the inductor L8b are virtually connected to ground, and the their function to each resonance circuit is disappeared, as shown in FIG.

20. Also, due to the symmetry of the structure, a resonance circuit is taken for analysis as an example, as shown in FIG. 17. The even-odd mode analysis method is used for analysis. At this time, the resonance circuit is in an odd mode. As viewed from the A end or from the B end, and the equivalent resonance circuit of FIG. 17 can be represented as the circuit shown in FIG. 18. As viewed from the A end, the inductor L1 and the capacitor C1 are connected in parallel, the equivalent resonance frequency of the resonance circuit viewed from the A end is $$f_4 = 1 / (2\pi \sqrt{L_2 C}).$$

By the same reasoning, equivalent resonance frequencies viewed from the other ends of each resonance circuit are the same as the equivalent resonance frequency viewed from the A end.

Figure 21:
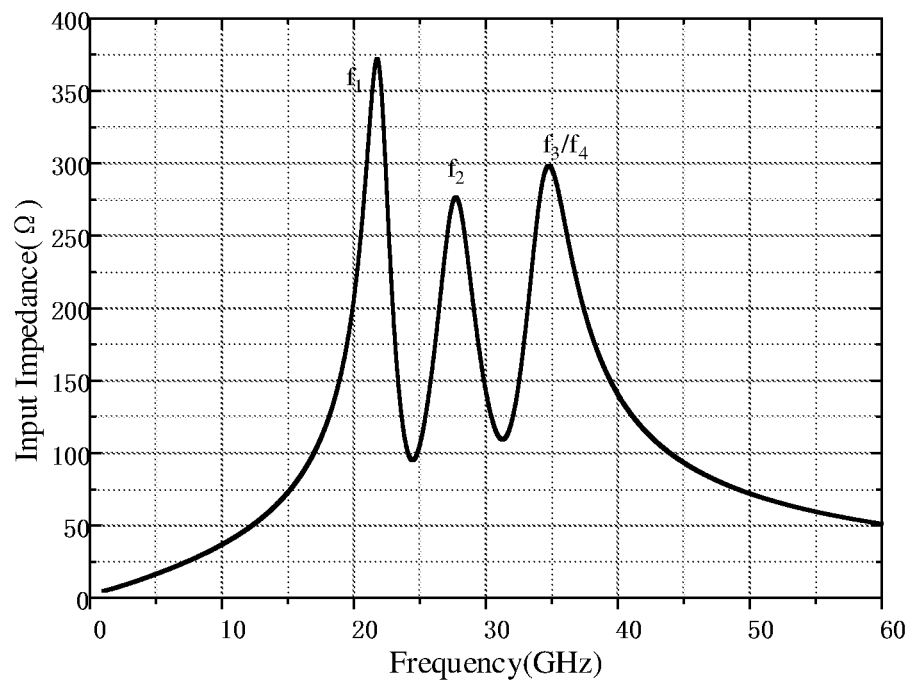
FIG. 21 is a schematic diagram illustrating a relationship between a resonance peak and a frequency according to an embodiment of the present disclosure.

Through the above analysis, each resonance circuit can generate four resonance frequencies under excitation of signals with different phases. $f_3$ and $f_4$ are the same. The resonance peak is used to represent an impedance of the at least four resonance circuits. Corresponding to the four resonance frequencies, three resonant peaks are formed, as shown in FIG. 21.

Figure 22:
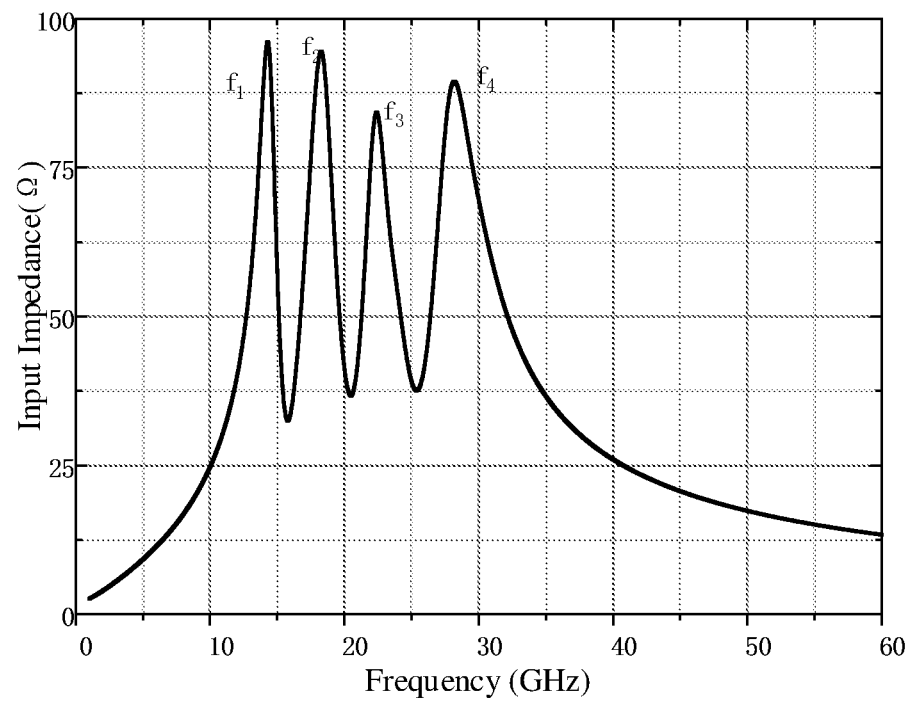
FIG. 22 is a schematic diagram illustrating a relationship between a resonance peak and a frequency according to an embodiment of the present disclosure.

In an embodiment, if the inductor L1 and the inductor L6, and the inductor L4 and the inductor L9 in the resonance circuit are coupled, $f_3$ and $f_4$ may be different. Then, the corresponding four resonances may form four resonance peaks together, as shown in FIG. 22. Spacing between the resonance peaks corresponding to $f_3$ and $f_4$ is related to the coupling coefficients of the inductor L1 and the inductor L5, and the coupling coefficient of the inductor L4 and the inductor L9. The larger the coupling coefficient, the larger the spacing between the corresponding resonance peaks.

The respective technical features of the above embodiments can be combined arbitrarily, and in order to brief the description, not all possible combinations of the respective technical features in the above embodiments are described; however, as long as the combination of these technical features does not have any contradiction, it should be considered to be the scope of disclosure disclosed in the present description.

The above embodiments merely express several embodiments of the present disclosure, and the description thereof is more specific and detailed, but cannot be construed as limiting the scope of the present disclosure. It should be noted that, for a person of ordinary skill in the art, several modifications and improvements can also be made without departing from the concept of the present disclosure, which all belong to the scope of protection of the present disclosure. Therefore, the scope of protection of the present disclosure should be regarded by the appended claims.

What is claimed is:

1. A multi-mode voltage controlled oscillation device, comprising:
    an oscillation core circuit;
    a first resonance circuit having a first first resonance circuit input end coupled to a first oscillation core circuit output end, a second first resonance circuit input end coupled to a second oscillation core circuit output end, and a first resonance circuit power supply end coupled to a power supply, wherein the first resonance circuit includes:
        a first inductor having a first first inductor end coupled to the first oscillation core circuit output end;
        a second inductor having a first second inductor end coupled to the second oscillation core circuit output end, and a second second inductor end coupled to a second first inductor end;
        a third inductor having a first third inductor end coupled to the second second inductor end, and a second third inductor end coupled to the power supply;
        a first capacitor having a first first capacitor end coupled to a first first inductor end, and a second first capacitor end that is grounded; and
        a second capacitor having a first second capacitor end coupled to the first second inductor end, and a second second capacitor end that is grounded;
    a second resonance circuit having a first second resonance circuit input end coupled to a third oscillation core circuit output end, a second second resonance circuit input end coupled to a fourth oscillation core circuit output end, and a second resonance circuit power supply end coupled to the power supply;
    a third resonance circuit having a first third resonance circuit input end coupled to a fifth oscillation core circuit output end, a second third resonance circuit input end coupled to a sixth oscillation core circuit output end, and a third resonance circuit power supply end coupled to the power supply; and
    a fourth resonance circuit having a first fourth resonance circuit input end coupled to a seventh oscillation core circuit output end, a second fourth resonance circuit input end coupled to an eighth oscillation core circuit output end, and a fourth resonance circuit power supply end coupled to the power supply.

2. The multi-mode voltage controlled oscillation device according to claim 1, wherein the oscillation core circuit includes:
    a first oscillation core sub-circuit having a first first oscillation core sub-circuit end coupled to the first first resonance circuit input end, and a second first oscillation core sub-circuit end coupled to the first second resonance circuit input end;
    a second oscillation core sub-circuit having a first second oscillation core sub-circuit end coupled to the second first resonance circuit input end, and a second second oscillation core sub-circuit end coupled to the second second resonance circuit input end;
    a third oscillation core sub-circuit having a first third oscillation core sub-circuit end coupled to the second third resonance circuit input end, and a second third oscillation core sub-circuit end coupled to the second fourth resonance circuit input end; and
    a fourth oscillation core sub-circuit having a first fourth oscillation core sub-circuit end coupled to the first third resonance circuit input end, and a second fourth oscillation core sub-circuit end coupled to the first fourth resonance circuit input end.

3. The multi-mode voltage controlled oscillation device according to claim 2, wherein the first oscillation core sub-circuit includes:
    a current source having a first current source end that is grounded;
    a first field effect transistor having a first field effect transistor gate coupled to the first first resonance circuit input end, a first field effect transistor source coupled to a second current source end, and a first field effect transistor drain coupled to the first second resonance circuit input end; and a second field effect transistor having a second field effect transistor gate coupled to the first second resonance circuit input end, a second field effect transistor source coupled to the second current source end, and a second field effect transistor drain coupled to the first first resonance circuit input end.

4. The multi-mode voltage controlled oscillation device according to claim 3, further comprising:
a switch circuit coupled to the input ends of each of the resonance circuits respectively; and
a control device coupled to a switch circuit control end, and adapted to control connection and disconnection between the respective input ends of the resonance circuits through the switch circuit to generate different resonance frequencies.

5. The multi-mode voltage controlled oscillation device according to claim 4, wherein the switch circuit includes:
a first switch sub-circuit having a first first switch sub-circuit input end coupled to the second first resonance circuit input end, a second first switch sub-circuit input end coupled to the second second resonance circuit input end, a first first switch sub-circuit output end coupled to the first first resonance circuit input end, a second first switch sub-circuit output end coupled to the first second resonance circuit input end, and a first switch sub-circuit control end coupled to the control device;
a second switch sub-circuit having a first second switch sub-circuit input end coupled to the first first resonance circuit input end, a second second switch sub-circuit input end coupled to the first second resonance circuit input end, a first second switch sub-circuit output end coupled to the first third resonance circuit input end, a second second switch sub-circuit output end coupled to the first fourth resonance circuit input end, and a second switch sub-circuit control end coupled to the control device;
a third switch sub-circuit having a first third switch sub-circuit input end coupled to the second fourth resonance circuit input end, a second third switch sub-circuit input end coupled to the second third resonance circuit input end, a first third switch sub-circuit output end coupled to the first fourth resonance circuit input end, a second third switch sub-circuit output end coupled to the first third resonance circuit input end, and a third switch sub-circuit control end coupled to the control device; and
a fourth switch sub-circuit having a first fourth switch sub-circuit input end coupled to the second first resonance circuit input end, a second fourth switch sub-circuit input end coupled to the second second resonance circuit input end, a first fourth switch sub-circuit output end coupled to the second third resonance circuit input end, a second fourth switch sub-circuit output end coupled to the second fourth resonance circuit input end, and a fourth switch sub-circuit control end coupled to the control device.

6. The multi-mode voltage controlled oscillation device according to claim 5, wherein the first switch sub-circuit includes:
a third field effect transistor having a third field effect transistor gate coupled to the control device, a third field effect transistor drain coupled to the second first resonance circuit input end, and a third field effect transistor source coupled to the first first resonance circuit input end;
a fourth field effect transistor having a fourth field effect transistor gate coupled to the control device, a fourth field effect transistor drain o coupled to the second second resonance circuit input end, and a fourth field effect transistor source coupled to the first second resonance circuit input end;
an inverter having an inverter input end coupled to the control device;
a fifth field effect transistor having a fifth field effect transistor gate coupled to an inverter output end, a fifth field effect transistor drain coupled to the second first resonance circuit input end, and a fifth field effect transistor source coupled to the first second resonance circuit input end; and
a sixth field effect transistor having a sixth field effect transistor gate coupled to an inverter output end, a sixth field effect transistor drain coupled to a second second resonance circuit input end, and a sixth field effect transistor source coupled to the first first resonance circuit input end.

7. The multi-mode voltage controlled oscillation device according to claim 6, wherein the third, fourth, fifth, and sixth field effect transistors are all P-channel field effect transistors.

8. The multi-mode voltage controlled oscillation device according to claim 1, wherein first, second, third, and fourth resonance circuits have a same structure.

9. The multi-mode voltage controlled oscillation device according to claim 2, wherein the first, second, third, and fourth oscillation core sub-circuits have a same structure.

10. The multi-mode voltage controlled oscillation device according to claim 6, wherein the first, second, third, and fourth switch sub-circuits have a same structure.

11. A wireless transceiver, comprising the multi-mode voltage controlled oscillation device according claim 1.

* * * * *